(12) United States Patent
Nakahira et al.

(10) Patent No.: US 8,237,119 B2
(45) Date of Patent: Aug. 7, 2012

(54) SCANNING TYPE CHARGED PARTICLE BEAM MICROSCOPE AND AN IMAGE PROCESSING METHOD USING THE SAME

(75) Inventors: Kenji Nakahira, Fujisawa (JP); Atsushi Miyamoto, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 561 days.

(21) Appl. No.: 12/414,759

(22) Filed: Mar. 31, 2009

(65) Prior Publication Data
US 2009/0266985 A1 Oct. 29, 2009

(30) Foreign Application Priority Data
Mar. 31, 2008 (JP) ................. 2008-089133

(51) Int. Cl.
*G21N 23/00* (2006.01)
*G21K 7/00* (2006.01)
(52) U.S. Cl. ........ 250/307; 250/306; 250/310; 250/311; 250/396 R; 250/559.39
(58) Field of Classification Search .......... 250/306, 250/307, 310, 311, 396 R, 559.39
See application file for complete search history.

(56) References Cited

U.S. PATENT DOCUMENTS
2005/0194535 A1* 9/2005 Noji et al. ............. 250/311
2006/0018532 A1* 1/2006 Tanaka et al. .......... 382/145

FOREIGN PATENT DOCUMENTS
| JP | 63-211472 | 9/1988 |
| JP | 03-044613 | 2/1991 |
| JP | 2002-328015 | 11/2002 |
| JP | 2006-351888 | 12/2006 |
| JP | 2007-304959 | 11/2007 |

OTHER PUBLICATIONS

SEM Image Sharpening by Reversing the Effect of Non-ideal Beam Spot, Gold et al, Applied Materials/Opal, P.O. Box 416, Nes Ziona 70451, Israel, SPIE vol. 3332 pp. 620-624.
Office Action issued in Japanese Patent Application No. 2008-089133 on Mar. 13, 2012.

* cited by examiner

*Primary Examiner* — Jack Berman
*Assistant Examiner* — Meenakshi Sahu
(74) *Attorney, Agent, or Firm* — Antonelli, Terry, Stout & Kraus, LLP.

(57) ABSTRACT

Design data and sample characteristic information corresponding to individual areas on the design data are used to perform an image quality improvement operation to make appropriate improvements on image quality according to sample characteristic corresponding to the individual areas on the image, allowing a high speed area division on the image. Further, the use of a database that stores image information associated with the design data allows for an image quality improvement operation that automatically emphasizes portions of the image that greatly differ from past images of the similar design data.

11 Claims, 9 Drawing Sheets

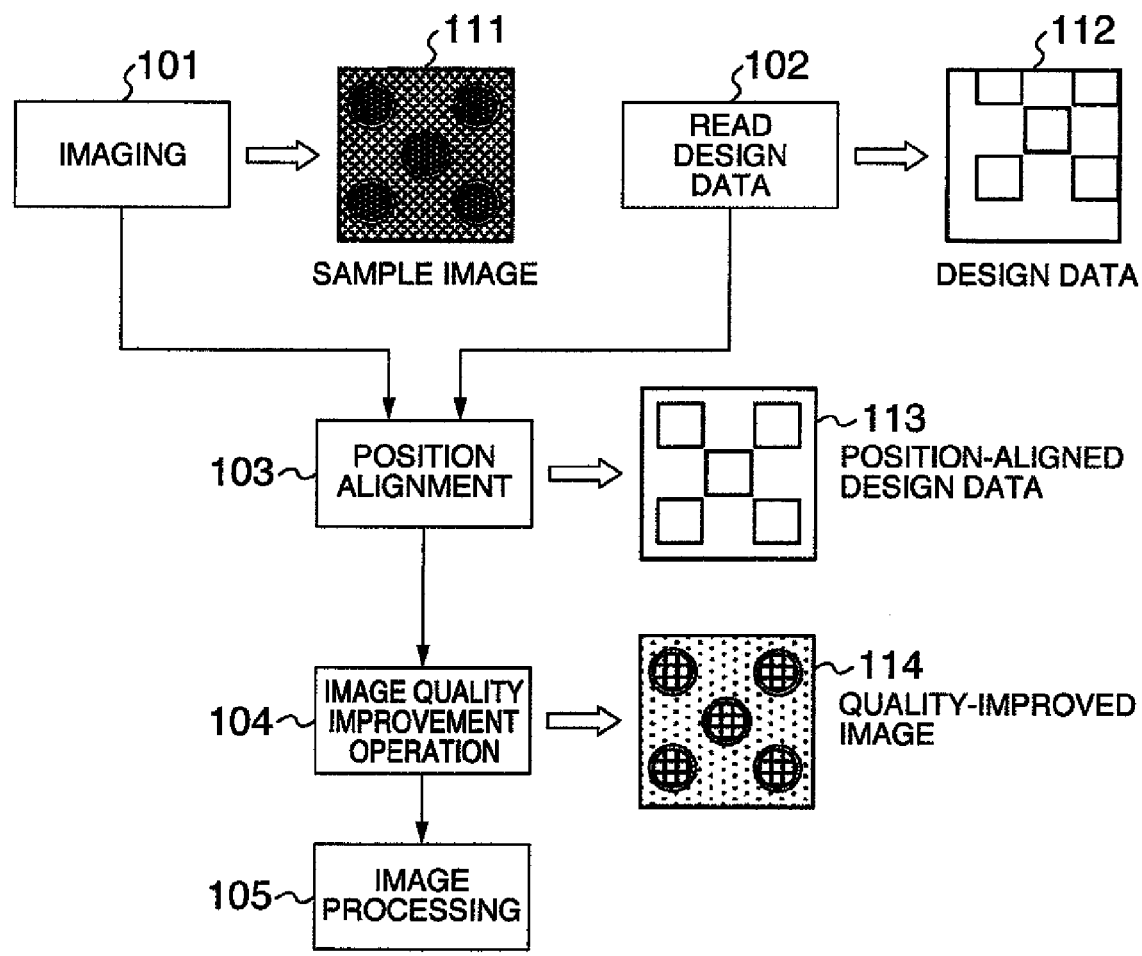

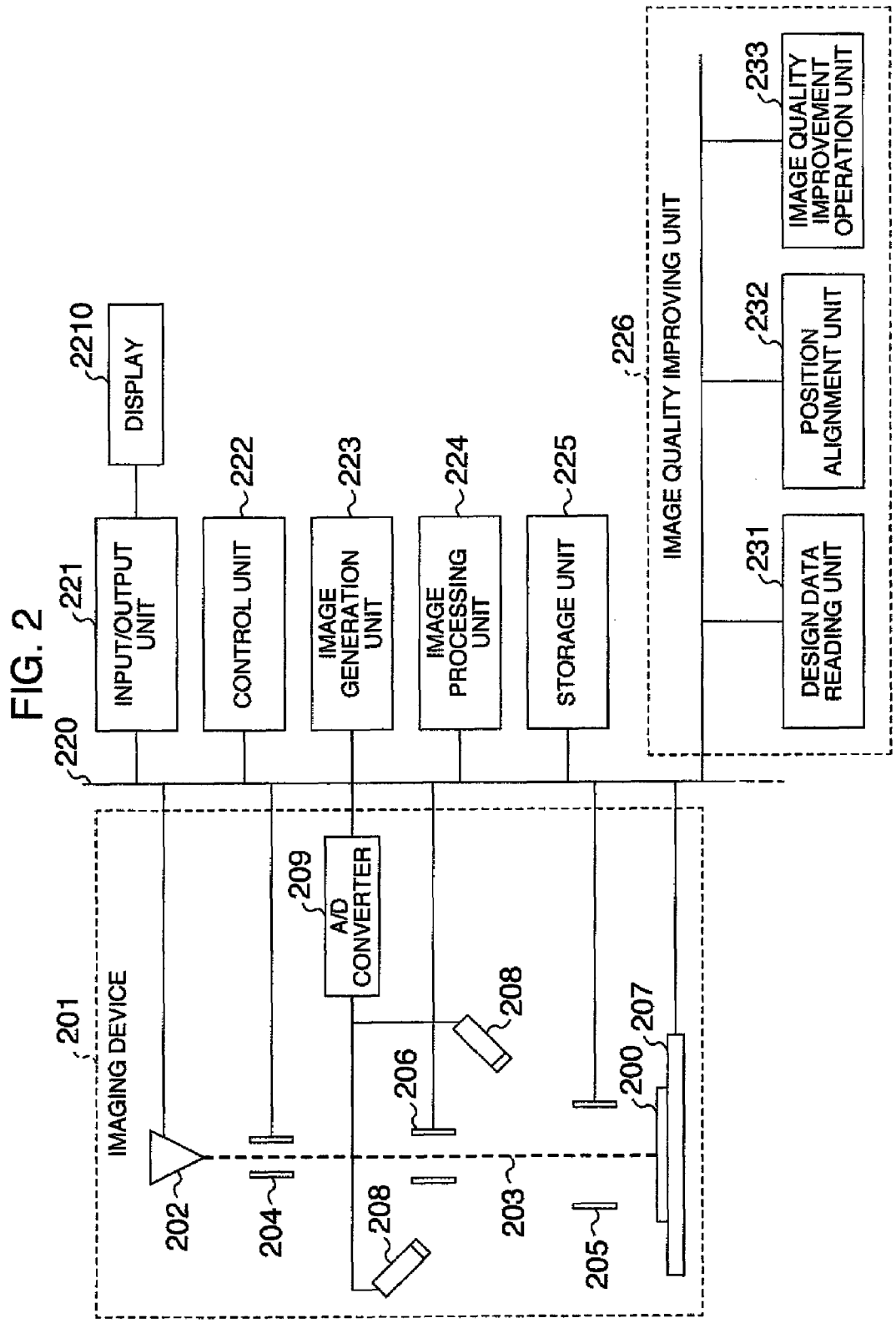

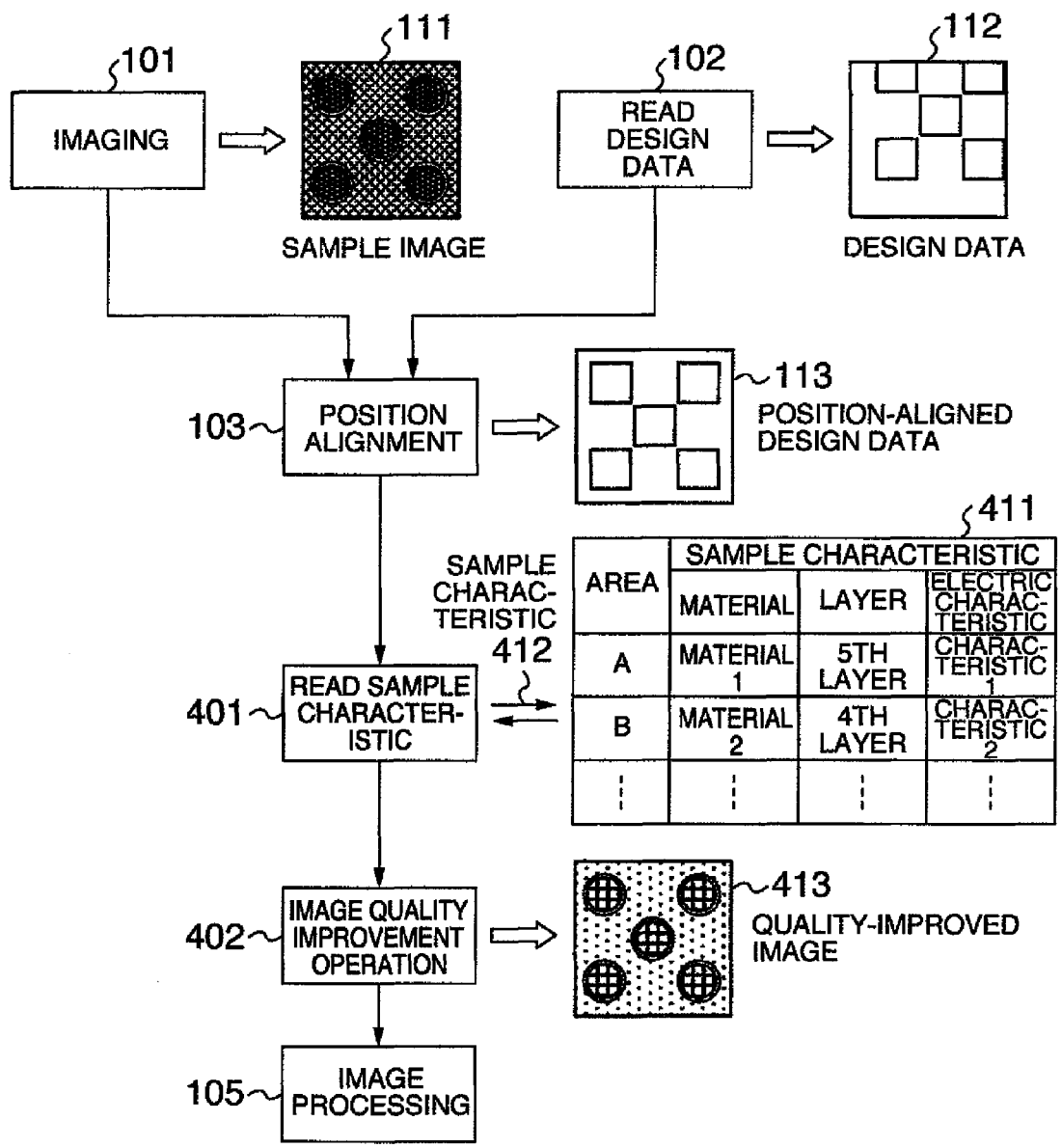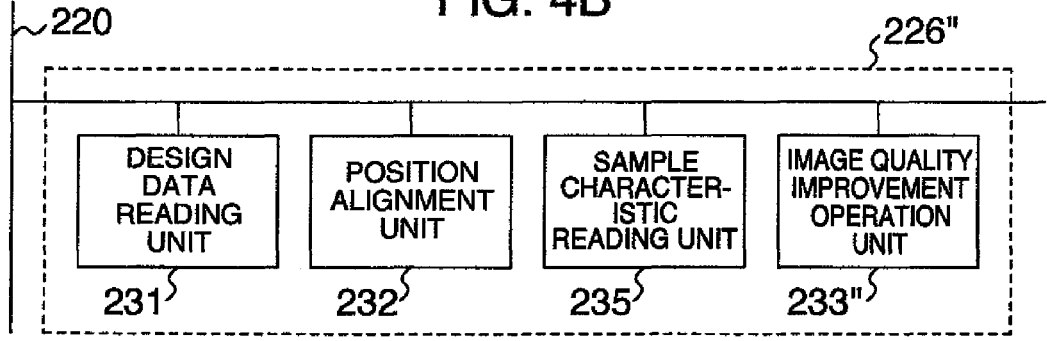

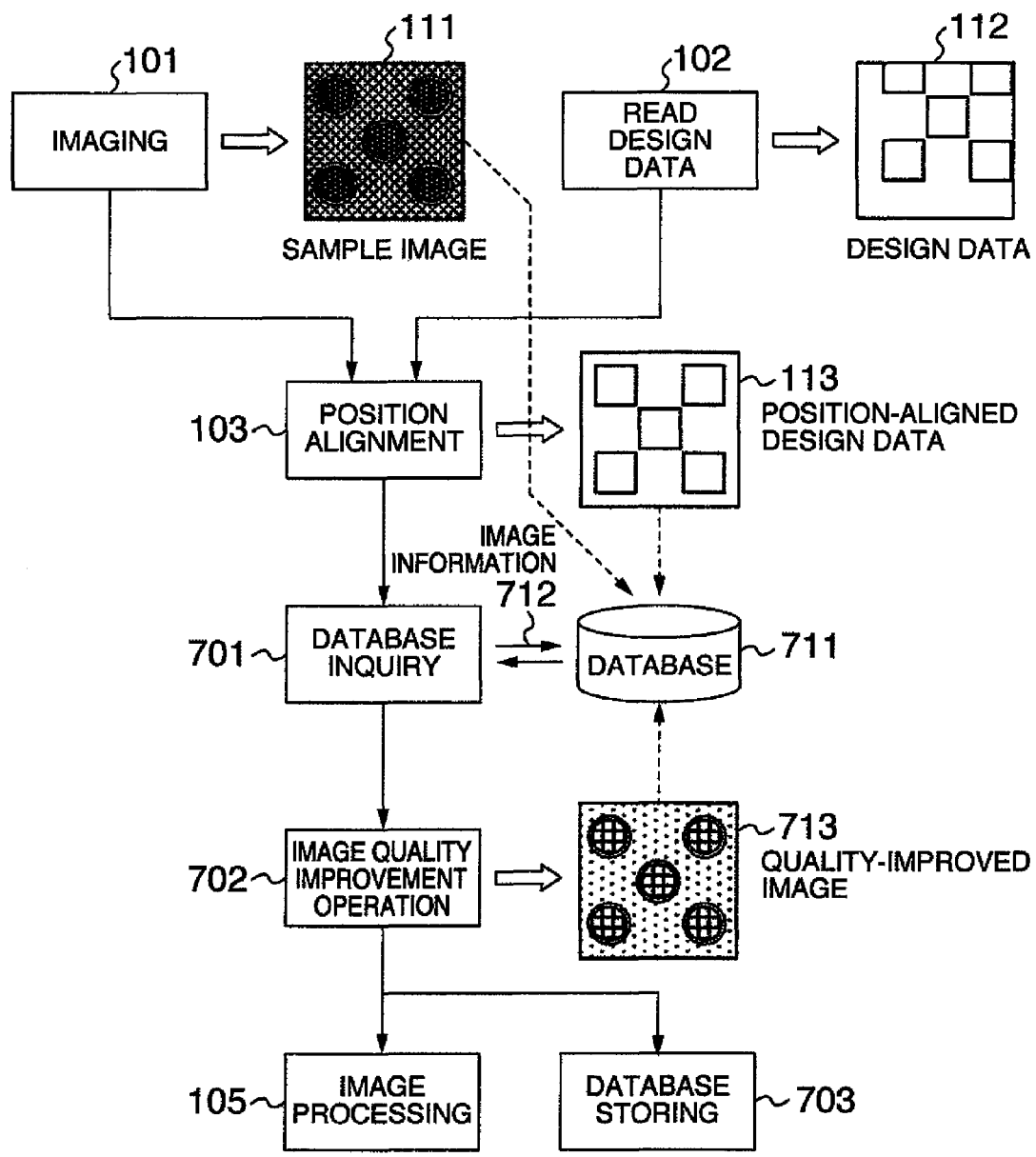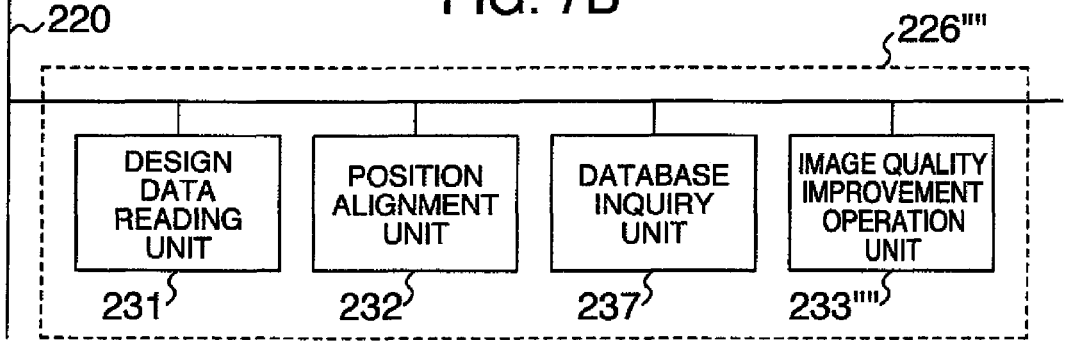

801
◆ DISPLAY INTENSITY
- EDGE: HIGH ▼  (811)
- LOWER LAYER: NOT DISPLAYED ▼  (812)

802
◆ BRIGHTNESS
- HOLE BOTTOM: HIGH ▼  (821)

◆ CONTRAST
- INSIDE OF AREA: HIGH ▼  (822)
- BETWEEN AREAS: LOW ▼  (823)

| MATERIAL | BRIGHTNESS | CONTRAST |
|---|---|---|
| MATERIAL 1 ▼ | STANDARD ▼ | STANDARD ▼ |
| MATERIAL 2 ▼ | BRIGHT ▼ | HIGH ▼ |
| ⋮ | ⋮ | ⋮ |

(824)

803
◆ USE OF DATABASE
- USE OF DATABASE: ON ▼  (806)
- ADDING AVERAGE: HIGH ▼  (807)

804
◆ PREVIEW

- 812: DESIGN DATA
- 813: SAMPLE IMAGE
- 814: QUALITY-IMPROVED IMAGE

SCANNING TYPE CHARGED PARTICLE BEAM MICROSCOPE AND AN IMAGE PROCESSING METHOD USING THE SAME

INCORPORATION BY REFERENCE

The present application claims priority from Japanese application JP2008-089133 filed on Mar. 31, 2008, the content of which is hereby incorporated by reference into this application.

BACKGROUND OF THE INVENTION

The present invention relates to a scanning type charged particle beam microscope that radiates charged particles against a sample to obtain its image and an image processing method using this microscope. More specifically, the present invention relates to a method and a device that perform an image quality improvement operation on the obtained image.

For a clear observation of minute structures of an object being examined, scanning type charged particle beam microscopes with a higher resolution than that of optical microscopes are widely in use. The charged particle beam microscope irradiates a sample under inspection with a charged particle beam and detects charged particles released from the sample or those that have passed through it (charged particles of the same or different species than that of the irradiated charged particles, or electromagnetic waves) to produce an enlarged image of the sample being inspected.

In a semiconductor manufacturing process, scanning type charged particle beam microscopes such as a scanning electron microscope (SEM), a scanning ion microscope (SIM) and a scanning transmission electron microscope are used for such applications as semiconductor wafer inspection and pattern measurement. In these applications, images that are shot are used for observation of semiconductor patterns and defects, for defect detection and analysis of causes and for measurement of pattern dimensions.

In the scanning type charged particle beam microscope, the function of providing high quality images is one of its most important functions. Although improvements of hardware such as a charged-particle-beam optical system and a detection system can allow for enhanced resolution and S/N of images to a certain degree, there is a limit. As to the resolution, diffraction aberrations caused by charged particles having a nature of waves and chromatic and spherical aberrations due to characteristics of charged particle lens will inevitably result in a degradation of the resolution. As for the S/N, it can be enhanced by increasing the amount of charged particle beam to be radiated. This method, however, has a problem of causing damages to a sample or prolonging the imaging time. In practice therefore, the amount of charged particle beam that can be applied is limited, resulting sometimes in a failure to secure a sufficient S/N.

Other than the method of improving hardware, a method is available that enhances the resolution and the S/N by performing an image quality improving operation on the sample image. As methods for improving the resolution and S/N, an edge emphasizing operation, an image restoration operation and a noise removing operation are proposed in JP-A-63-211472 and JP-A-3-44613. Among other image quality improving operations there is proposed a technique that performs a contrast correction operation on the sample image to adjust brightness and contrast appropriately and thereby enhance the quality of the output image (e.g., Y. I. Gold and A. Goldenshtein: Proc. SPIE, 3332, pp. 620-624 (1998)).

JP-A-2002-328015 describes a method that uses a matching operation to align positions of two images.

In the methods proposed by JP-A-63-211472 and JP-A-3-44613 and by Y. I. Gold and A. Goldenshtein: Proc. SPIE, 3332, pp. 620-624 (1998), the image quality improvement operation is done by using only a sample image or by using the sample image and imaging or shooting conditions (an acceleration voltage of charged particle beam, a probe current, etc.). The above methods, however, do not perform an operation using design data or an operation using design data and sample characteristic information. Here, the design data refers to data representing information on geometries of semiconductor patterns to be manufactured, and in many cases describes the geometries of semiconductor patterns as by information on their outlines.

Therefore, with the conventional operations, a sufficient image quality improvement may not be obtained as described below.

The use of only the sample image and the imaging conditions cannot produce sample characteristic information for each area on the image. Nor can it decide whether spatially separate areas on the image have similar sample characteristics (material characteristics, electrical characteristics, layer characteristics, etc.). Therefore, it is not possible to perform an appropriate image quality improvement operation according to the sample characteristics of each area, make sample characteristic differences visible or emphasize only a sample having a particular characteristic In the conventional method, to perform operations, such as emphasizing a contrast between different areas and optimizing process parameters for each area, requires dividing the area of the image. However, the area division takes a long duration of processing and it is difficult to meet both requirements for a high precision of area division and a reduced processing time simultaneously.

The area on a sample that the user particularly wishes to observe is often the one where the difference between actual data and design data is large. The image quality improvement operation that automatically emphasizes such an area is difficult to perform with the conventional method.

SUMMARY OF THE INVENTION

An object of the present invention is to provide a scanning type charged particle beam microscope that can produce an image with an improved quality and an image processing method using the same.

To achieve the above objective, this invention adopts the following image quality improvement method when an image obtained by the scanning type charged particle beam microscope is processed to perform semiconductor wafer inspections, observations and pattern measurements.

The scanning type charged particle beam microscope of this invention comprises: a charged particle imaging unit having a charged particle beam irradiation unit to irradiate a focused charged particle beam to a surface of a sample formed with a pattern and to scan it over the surface, and a secondary charged particle imaging unit to detect secondary charged particles emitted from the sample as the charged particle beam irradiation unit irradiates and scans the charged particle beam over the sample and to generate a secondary charged particle image of the sample surface; an image processing means to process the secondary charged particle image of the sample surface generated by the charged particle imaging unit; and an output unit to output a result of processing by the image processing means; wherein the image processing means has an image quality improving unit to improve, by using the design data of the pattern formed on the sample, an image quality of the secondary charged particle image of the sample surface generated by the charged particle imaging unit, and an image processing unit to process the image whose quality has been improved by the image quality improving unit and to perform a detection of defects of the sample, a production of an image of defects or a measuring of dimensions of the pattern.

In the image processing method using a scanning type charged particle beam microscope, which irradiates and scans a focused charged particle beam over a surface of a sample formed with a pattern, detects secondary charged particles emitted from the sample, creates a secondary charged particle image of the sample surface, and processes the created secondary charged particle image of the sample surface; the image quality of the created secondary charged particle image of the sample surface is improved by using the design data of the pattern formed on the sample, the quality-improved image is processed to perform a detection of defects of the sample, a production of an image of defects or a measuring of dimensions of the pattern.

With this invention, an image from the scanning type charged particle beam electron is subjected to an image quality improvement operation using design data and sample characteristic information. This makes it possible not only to meet two conflicting requirements of higher precision and faster speed at the same time in such processing as image quality improvement operations reflecting sample characteristic differences and area division operations but also to emphasize portions of the displayed image where differences between the design data and the sample image is large. This in turn has resulted in enhanced accuracies in detecting defects in the sample, in creating an image of defects or in measuring dimensions of the pattern.

These and other objects, features and advantages of the invention will be apparent from the following more particular description of preferred embodiments of the invention, as illustrated in the accompanying drawings.

BRIEF DESCRIPTION OF THE DRAWINGS

FIG. 1 shows an example sequence of operation that involves taking a picture and improving an image quality.

FIG. 2 shows a basic configuration of a scanning type charged particle beam microscope as one embodiment of this invention.

FIG. 4A is a flow chart showing a sequence for performing the image improvement operation using design data and sample characteristic information.

FIG. 4B shows a configuration of an image quality improvement unit used in the image quality improvement operation.

FIG. 7A is a flow chart showing a sequence for performing an image quality improvement operation by using data stored in a database.

FIG. 7B shows a configuration of an image quality improvement unit used in the image quality improvement operation.

FIG. 8 shows an example of GUI screen in which to set parameters for the image quality improvement operation using the design data.

DETAILED DESCRIPTION OF THE EMBODIMENTS

This invention performs a high-performance image quality improvement operation on a sample image produced by a scanning type charged particle beam microscope in order to observe semiconductor patterns and defects, to perform defect detection and analysis of their causes, and to measure dimensions of the patterns.

Now, embodiments of this invention will be described using drawings, for a case in which the invention is applied to a defect observation device (review SEM) that uses a scanning electron microscope (SEM) or to a pattern dimension measuring device (CD-SEM).

FIG. 1 shows an example sequence for executing an image quality improvement operation on an image of a sample in a system using the SEM (hereinafter called a SEM system). First, at step 101 the SEM is used to photograph the sample formed with a pattern on its surface to obtain an image of the sample (SEM image) 111. At step 102, design data (CAD data) 112 of the pattern formed on the sample surface is read to obtain the design data 112 corresponding to the sample image 111. Since positional deviations usually occur between the sample image 111 and the design data 112, the design data 112 should be so sized as to include an area corresponding to the sample image 111 by retrieving data of a wider viewing field than at least that of the sample image 111. Next at step 103, the design data 112 is aligned in position with the sample image 111 to produce position-aligned design data 113.

Figure 6A:
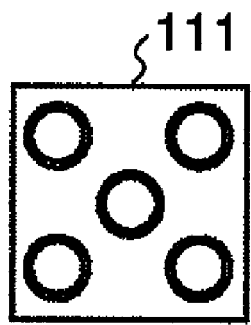
FIG. 6A shows an image of a sample.
Figure 6B:
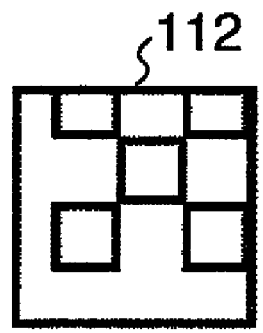
FIG. 6B shows a design data.
Figure 6C:
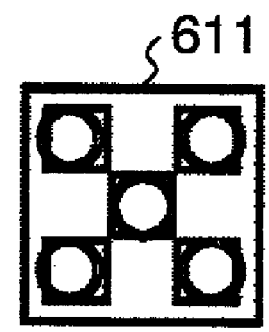
FIG. 6C shows a state in which the design data is overlapped over the sample image.

The position alignment will be explained by referring to FIGS. 6A to 6C. When the design data 112 of FIG. 6B is positionally aligned with the sample image 111 of FIG. 6A, the design data is shifted in x and y directions by required distances so that the design data is aligned in position with the sample image. A variety of position alignment techniques are available. For example, a matching operation as described in JP-A-2002-328015 may be employed. Next, the position-aligned design data 113 is used to perform the image quality improvement operation on the sample image in step 104 to produce a quality-improved image 114.

Further, in step 105 image processing may be executed using the quality-improved image produced at step 104 to observe semiconductor patterns and defects, perform defect detection and cause analysis, and measure pattern dimensions.

In this embodiment, the image quality improvement operation can be done using information that the design data has, including pattern area information and edge position and direction information. For example, parameters can be changed properly according to the pattern area information. Further, the degrees of noise removal and edge emphasis may be differentiated between a pattern edge area or surrounding area and an area not including the pattern. It is also possible to perform at high speed a smoothing operation along the direction of pattern edges to enhance the S/N without making the pattern edges dull. Dashed arrows in the drawings indicate that the operation at the destination of an arrow uses as supplements data and images provided at the originating point of the arrow.

FIG. 2 shows a basic configuration of the SEM system as one embodiment of this invention. The SEM system of this invention has an imaging device 201, an input/output unit 221, a control unit 222, an image generation unit 223, an image processing unit 224, a storage unit 225 and an image quality improving unit 226.

In the imaging device 201, an electron gun 202 generates an electron beam 203 which in turn is passed through a condenser lens 204 and an object lens 205 to focus it on the surface of a specimen 200. The focused electron beam 203 radiated to the surface of the specimen 200 is deflected in its projected path by a deflection electrode 206 to scan the specimen surface.

Next, secondary electrons or reflected electrons emitted from the specimen 200 as a result of the electron beam 203 being radiated against the surface of the specimen 200 are detected by a detector 208 and converted from an analog signal to a digital signal by an A/D converter 209 before being supplied to the image generation unit 223. The image generation unit 223 processes the digital signal to create an image by using signals by which the control unit 222 has controlled the deflection electrode 206, thus obtaining the sample image. The sample image thus obtained is stored in the storage unit 225. Two or more of the detectors 208 may be provided, each designed to detect different kinds of particles (secondary electrons and reflected electrons). It is also possible to use a construction that allows a plurality of sample images to be created in one shooting session.

The specimen 200 is mounted on the stage 207, which is moved and controlled by the control unit 222 so that an image of the specimen at any desired position can be obtained. The imaging device 201, the input/output unit 221, the control unit 222, the image generation unit 223, the image processing unit 224, the storage unit 225 and the image quality improving unit 226 are all interconnected via a signal line 220.

The input/output unit 221 has a display 2210 on which is shown a GUI (Graphic User Interface) that allows the user to input an imaging position and imaging condition and to obtain a sample image and a quality-improved image.

To control the imaging device 201, the control unit 222 adjusts a voltage to be applied to the electron gun 202 and focus points of the condenser lens 204 and the object lens 205 and controls a voltage to be applied to the deflection electrode 206 (that has a pair of X-direction deflection control electrodes and a pair of Y-direction deflection control electrode), a driving of the stage 207 and an operation timing of the A/D converter 209. The control unit 222 also controls the input/output unit 221, the image generation unit 223, the image processing unit 224, the storage unit 225 and the image quality improving unit 226.

The image processing unit 224 executes operations other than the image quality improvement operation, which include an operation to automatically focus the electron beam 203 on the surface of the specimen 200 and operations to observe a semiconductor pattern and defects by using the image improved by the image quality improving unit 226, to perform a defect detection and a cause analysis, and to measure pattern dimensions. In making observations of the semiconductor pattern and defects, the image containing the semiconductor pattern and defects whose quality has been improved by the image quality improving unit 226 is compared with a reference image to extract an image of the semiconductor pattern and defects, as in the conventional technique. Since the extracted image has its quality improved, image feature quantities of the semiconductor pattern and defects can be picked up precisely with increased reliability. This in turn allows for an assessment of finer geometries of semiconductor patterns, a classification of defect images and an examination of defect causes with high precision. In measuring pattern dimensions, the use of the quality-improved image can improve not only the measuring accuracy but also a reproducibility of the measurement.

In the storage unit 225 are stored sample images, design data, sample characteristic information, quality-improved images and image quality improvement parameters. As for the design data, it is also possible to retrieve necessary data from the design data stored in other storage unit not shown through a communication line and then store the retrieved data in the image processing unit 224.

The image quality improving unit 226 performs a series of operations, shown in FIG. 1, to generate the quality-improved image from the sample image. The image quality improving unit 226, as shown in FIG. 2, has a design data reading unit 231 to perform a design data reading 102, a position aligning unit 232 to perform a position alignment 103, and an image quality improvement operation unit 233 to perform an image quality improvement operation 104. Further, the image quality improving unit 226 may also include a geometry information correction unit (not shown) that performs a geometry information correction 301 described later and a sample characteristic reading unit (not shown) that performs a sample characteristic reading 401 described later.

Figure 3A:
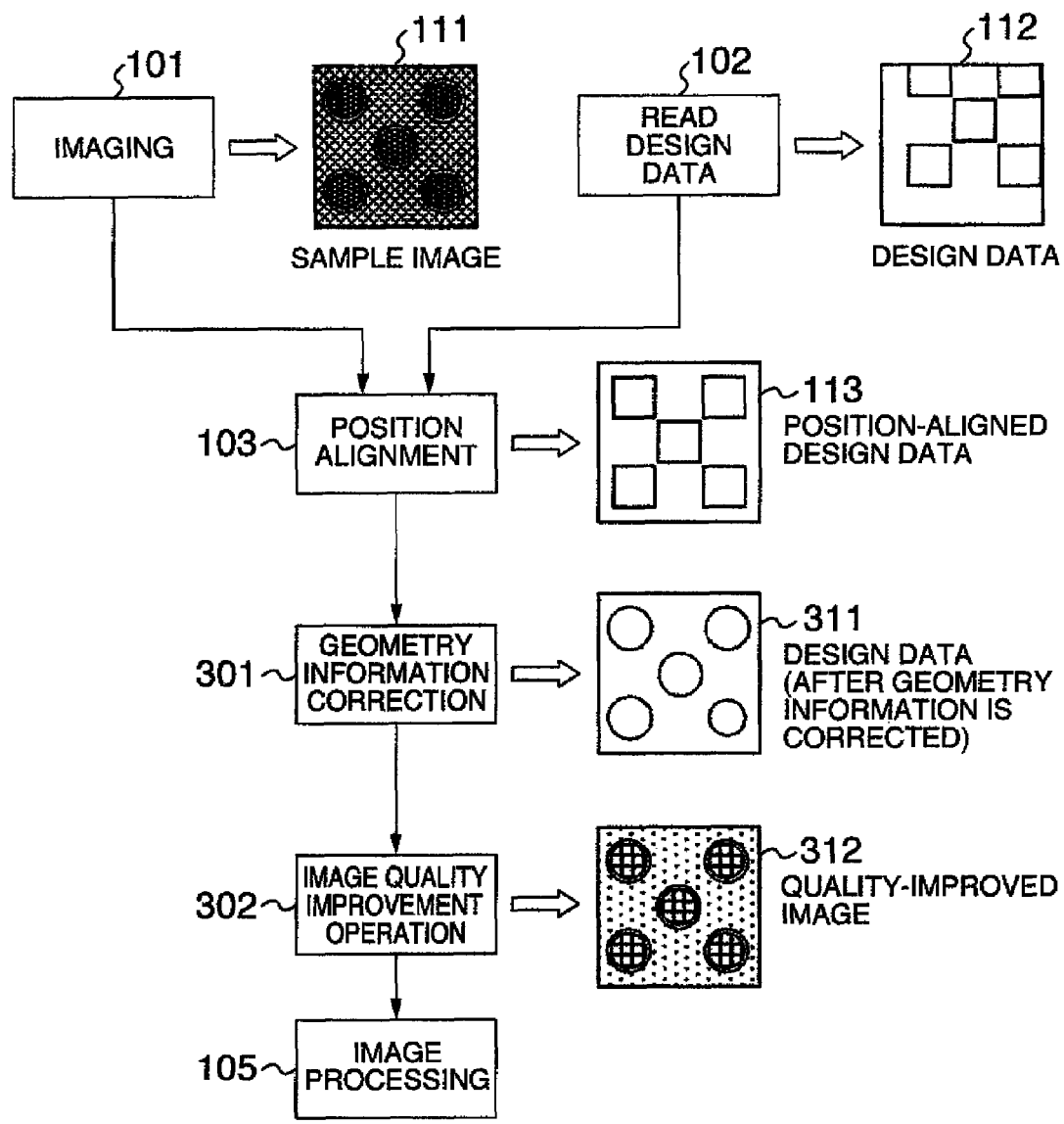
FIG. 3A is a flow chart showing a sequence in performing the image improvement operation using design data with corrected geometry information.

FIG. 3A shows an example sequence for executing the image quality improvement operation using the design data with corrected geometry information. Operations or data identical with those of FIG. 1 are assigned the same reference numbers of FIG. 1. What are performed in the operations of imaging 101, design data reading 102 and position alignment 103 are the same as explained by referring to FIG. 1.

In this embodiment, the position-aligned design data 113 produced by the position alignment 103 is subjected to the geometry information correction 301 to obtain geometry-information-corrected design data 311. The geometry information correction 301 may be done by litho simulation (a process of forming a pattern on a wafer by executing an etch with a resist pattern as a mask is simulated, thereby calculating a geometry of the pattern to be formed on the wafer). Alternatively, the design data may be corrected by using the information about the image of the sample.

Next, the geometry-information-corrected design data 311 is used to perform an image quality improvement operation 302 on the sample image 111 to create a quality-improved image 312. The use of the geometry-information-corrected design data 311 allows for retrieving more accurate information about pattern edge positions and edge directions, which in turn makes it possible to execute a high-performance image quality improvement operation.

Figure 3B:
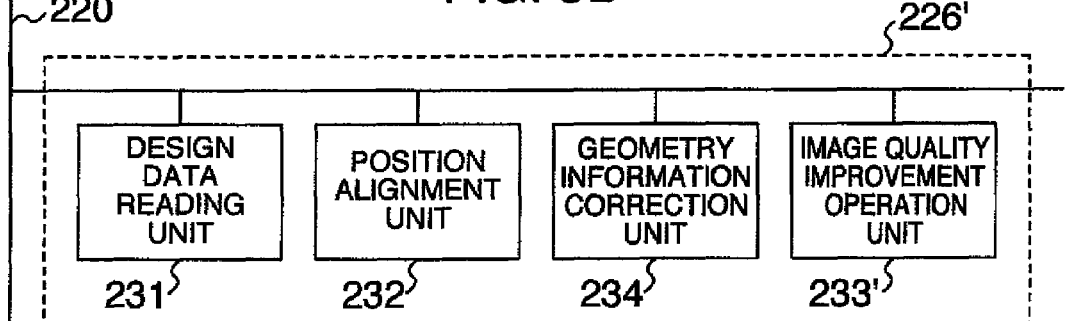
FIG. 3B shows a configuration of an image quality improvement unit used in the image quality improvement operation.

FIG. 3B shows a configuration of an image quality improving unit 226' in this embodiment. Portions having the same functions as in the image quality improving unit 226 of FIG.

2 are given the same reference numbers. The image quality improving unit 226' in this embodiment has a design data reading unit 231 that performs the design data reading 102, a position aligning unit 232 that performs the position alignment 103, a geometry information correction unit 234 that performs the geometry information correction 301, and an image quality improvement operation unit 233' that performs the image quality improvement operation 302.

The image processing 105, done by the image processing unit 224 using the quality-improved image 312 that has undergone the image quality improvement operation 302, is the same as explained by referring to FIG. 1, so its explanation is omitted here.

FIG. 4A shows an example sequence for performing the image quality improvement operation using the design data and the sample characteristic information. In this example, information on sample characteristics (material characteristic, electric characteristic, layer characteristic, etc.) is stored in advance in the storage unit 225. For the position-aligned design data 113 produced by the position alignment 103, sample characteristic 412 corresponding to each area within the design data 112 is read out from a table 411 by the sample characteristic reading 401.

Next, an image quality improvement operation 402 performs the image quality improvement on the sample image 111 by using both the position-aligned design data 113 and the corresponding sample characteristic 412 and obtains a quality-improved image 413. This operation allows for an image quality improvement reflecting the sample characteristic. Processing made possible by this image quality improvement operation 402 includes, for example, emphasizing only an area formed of a particular material, increasing contrast among low-contrast portions in a lower layer, or displaying areas that are easily charged positive at higher brightness. These processing can be performed easily. Which of these processing is suited may often vary depending on the purpose and situation. So, it is configured to allow the user to specify information on the characteristics that the user wants to emphasize on the display. Then the processing can be done according to the input from the user.

FIG. 4B shows a configuration of an image improving unit 226" in this embodiment. Portions having the same functions as in the image improving unit 226 of FIG. 2 are assigned the same reference numbers. The image improving unit 226" of this embodiment comprises a design data reading unit 231 that performs the design data reading 102, a position aligning unit 232 that performs the position alignment 103, a sample characteristic reading unit 235 that reads information on the sample characteristic 412 from the table 411 stored in the storage unit 225, and an image quality improvement operation unit 233" that performs the image quality improvement operation 402.

The image processing 105, done by the image processing unit 224 using the quality-improved image 413 that has undergone the image quality improvement operation 402, is the same as explained by referring to FIG. 1, so its explanation is omitted here.

Figure 5A:
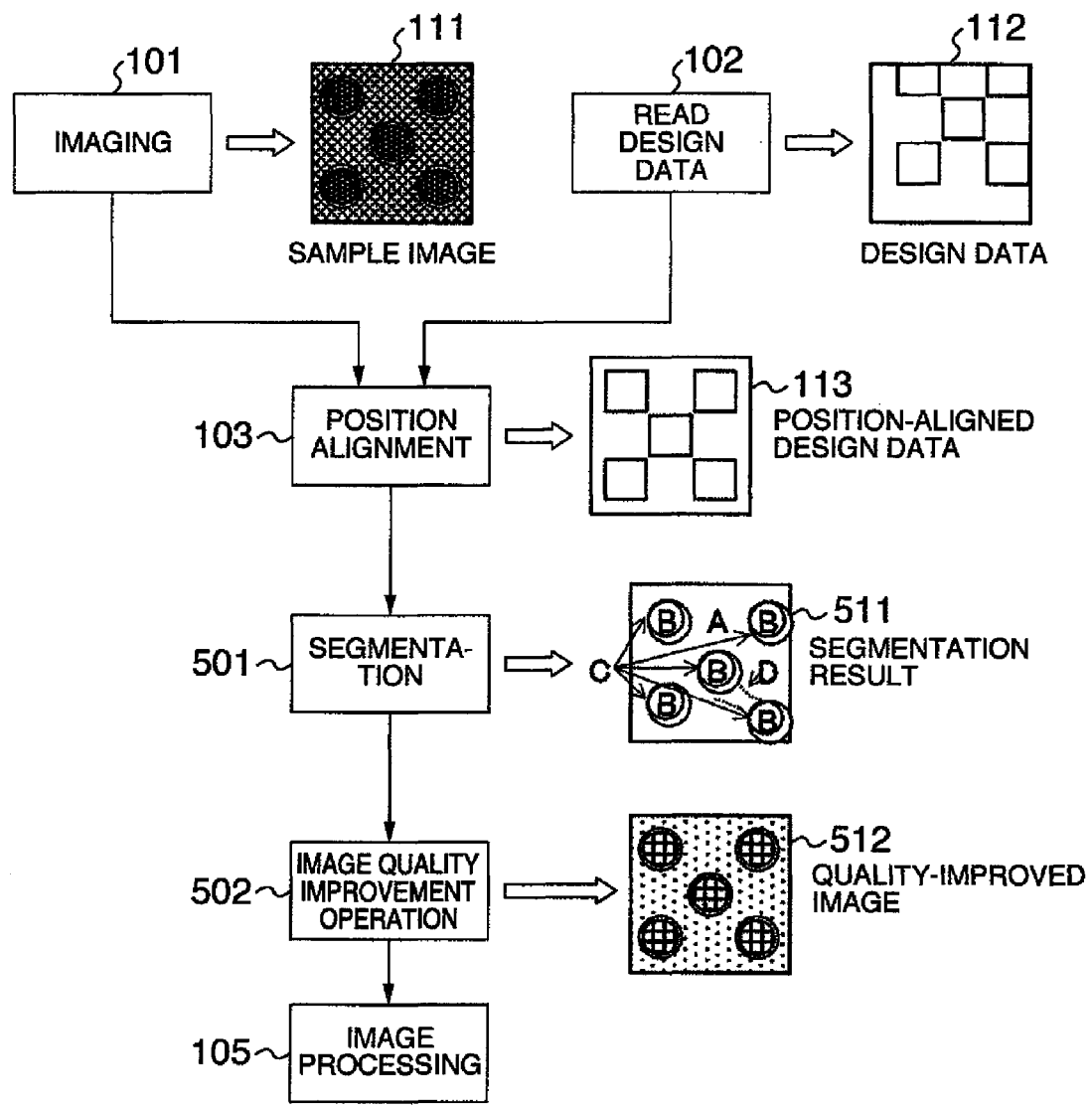
FIG. 5A is a flow chart showing a sequence for performing an image quality improvement operation by performing segmentation based on design data and using the result of the segmentation.

FIG. 5A shows an example sequence for executing an image quality improvement operation by using a result of segmentation performed using the design data. The segmentation represents processing to divide an image into smaller sub-areas. The image segmentation involves dividing the sample image 111 into individual pattern areas using the position-aligned design data 113 or into groups of similar patterns.

The process flow shown in FIG. 5A will be explained. First, in a step of imaging 101, a sample formed with a pattern on its surface is imaged by using the imaging device 201 to produce a sample image 111. At step 102, the design data 112 of the pattern formed on the surface of the sample is read to obtain the design data 112 corresponding to the sample image 111. Next, at step of position alignment 103, positional shifts between the sample image 111 and the design data 112 are corrected. Then, based on the position-aligned design data 113 that has undergone the position alignment 103, the sample image 111 is segmented by a segmentation 501 to obtain a segmentation result 511. Next, by using the segmentation result 511, the image quality improvement operation 502 is performed on each of the areas divided by the segmentation to create a quality-improved image 512.

The image quality improvement operation 502 may use the position-aligned design data 113. Further, the segmentation 501 may be performed on an image being processed by the image quality improvement operation 502, rather than on the sample image 111. Since this embodiment allows for the image quality improvement operation on the segmented images, it is possible to easily perform various processing, such as executing different image quality improvement operations on different areas and changing parameters for determining a degree of contrast emphasis.

Figure 5B:
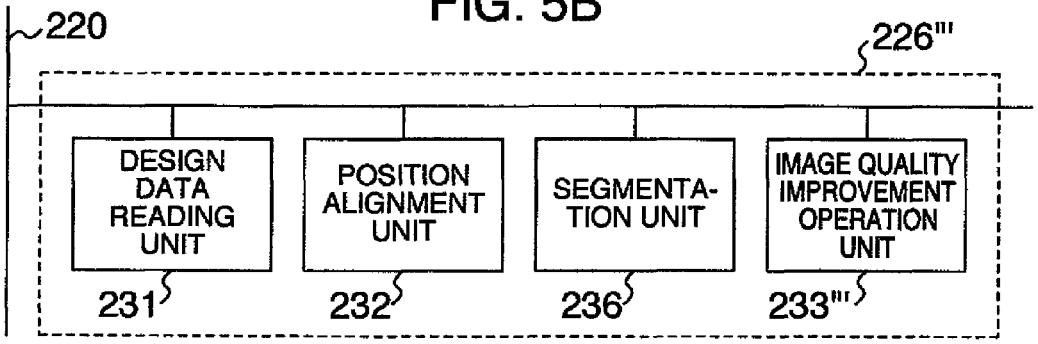
FIG. 5B shows a configuration of an image quality improvement unit used in the image quality improvement operation.

FIG. 5B shows a configuration of an image quality improving unit 226''' in this embodiment. Portions having the same functions as in the image quality improving unit 226 are given the same reference numbers. The image quality improving unit 226''' in this embodiment comprises a design data reading unit 231 that performs the design data reading 102, a position aligning unit 232 that performs the position alignment 103, a segmentation unit 236 that performs segmentation on the sample image 111, and an image quality improvement operation unit 233" that performs the image quality improvement operation 502.

The image processing 105, done by the image processing unit 224 using the quality-improved image 512 that has undergone the image quality improvement operation 502, is the same as explained by referring to FIG. 1, so its explanation is omitted here.

FIG. 7A shows an example sequence for performing an image quality improvement operation using data accumulated in a database. A process flow shown in FIGS. 7A and 7B will be explained. First, at step of imaging 101, a sample formed with a pattern on its surface is imaged by the imaging device 201 to produce a sample image 111. At step 102, the design data 112 of the pattern formed on the surface of the sample is read to get the design data 112 corresponding to the sample image 111. Next, at step of position alignment 103, positional shifts between the sample image 111 and the design data 112 are corrected. Then, based on the position-aligned design data 113 whose positional shifts have been corrected, a database inquiry 701 is made to query a database 711. The database 711 stores design data and corresponding image information.

Image information refers to a sample image, or quality-improved image, or information obtained from these images, and information associated with these images. The image information may include, for example, edge information obtained by performing an edge extraction operation on the sample image and parameters for image quality improvement operation. At step of database inquiry 701, design data similar to the position-aligned design data 113 is searched in the database 711 to retrieve the corresponding image information 712. Next, at step of image quality improvement operation 702, the image quality improvement operation is performed on the sample image 111 by using the position-aligned design data 113 and the image information 712 to generate a quality-improved image 713.

FIG. 7B shows a configuration of an image quality improving unit 226"" in this embodiment. Portions having the same functions as in the image quality improving unit 226 of FIG. 2 are given the same reference numbers. The image quality improving unit 226"" in this embodiment comprises a design data reading unit 231 that performs the design data reading 102, a position aligning unit 232 that performs the position alignment 103, a database inquiry unit 237 that queries the database 711 by using the design data 113 and an image quality improvement operation unit 233"" that performs the image quality improvement operation 702.

The image processing 105, done by the image processing unit 224 using the quality-improved image 713 that has undergone the image quality improvement operation 702, is the same as explained by referring to FIG. 1, so its explanation is omitted here.

The position-aligned design data 113, the sample image 111, the quality-improved image 713, etc. are stored in the database 711 by a database storing 703, as required. Dashed line arrows in FIGS. 7A and 7B represent flows of data as it is stored in the database 711 during the database storing 703. With this embodiment the image quality improvement operation can be performed by using information on images having similar circuit patterns that were retrieved in the past. Therefore, by averaging the images that were retrieved in the past, further enhancement of S/N can be realized. It is also possible to prevent a contrast from becoming large by using parameters similar to those of other quality-improved images with similar circuit patterns.

FIG. 8 shows one embodiment of a GUI screen 800 on which to set parameters for the image quality improvement operation using design data. This GUI screen is shown on a display 2210 connected to the input/output unit 221 in the configuration of FIG. 2. In this embodiment the GUI screen is shown to have fields in which to display setting items for display intensity 801, setting items for brightness and contrast 802 and setting items for database use 803.

Among setting items associated with a display intensity 801 are, for example, display intensities 812 at an edge portion 811 of the pattern and at a lower layer of the pattern. Setting items 802 associated with brightness and contrast include, for example, a setting item 821 for a brightness at the bottom of a holed area of the sample, a setting item 822 for a contrast within one and the same area and a setting item 823 for a contrast among different areas. It is also possible to provide a setting item 824 that matches an area having a particular sample characteristic with a degree of display intensity. Among setting items 803 associated with the use of database are, for example, a setting item 806 for specifying whether or not to use the database and a setting item 807 for adding to the current sample image other sample images corresponding to the similar design data and then averaging them. Further, a preview screen 804 for presenting the image quality may be provided.

Figure 9A:
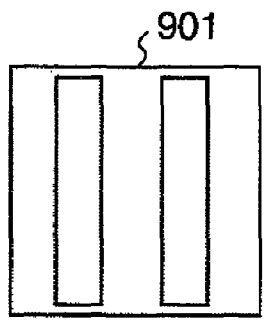
FIG. 9A shows a sample image.
Figure 9B:
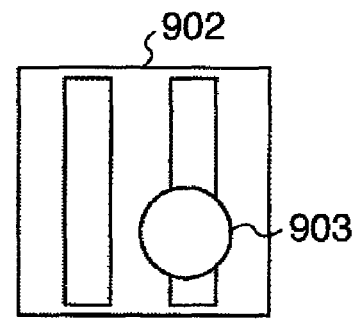
FIG. 9B shows another sample image of a pattern of the same shape as FIG. 9A which includes a foreign particle.

In the preview screen 804 are shown an example of design data 812, an example of sample image 813 and an example of quality-improved image 814 that is obtained by using parameters specified by the display intensity setting item 801, the brightness and contrast setting item 802 and the database use setting item 803. With such a GUI screen 800, it is possible to present a suitable image to the user that conforms to individual image quality evaluation references FIGS. 9A and 9B are diagrams of one embodiment showing that it is necessary to perform the image quality improvement operation 702 using data stored in the database 711, such as shown in the embodiment of FIGS. 7A and 7B. A sample image 901 and a sample image 902 are example sample images obtained by imaging the same pattern. The sample image 902 shows an extraneous matter 903 on the pattern. In this case, if the image quality improvement operation is performed on the sample image without using the information of the design data, the presence of the extraneous matter 903 may cause the contrast to differ greatly between the sample images 901 and 902. Considering the fact that the individual design data 112 has no foreign matters thereon, the contrasts of the sample image 901 and the sample image 902 can be made equal by using the information of the design data 112. Further, the use of the data stored in the database 711 enables stable operations. For example, by searching through the database 711 for samples images having the similar design data, like the sample image 901, before executing the image quality improvement operation on the sample image 902, the parameters for the image quality improvement operation on the sample image 901 can be used to execute the image quality improvement operation on the sample image 902.

Figure 10A:
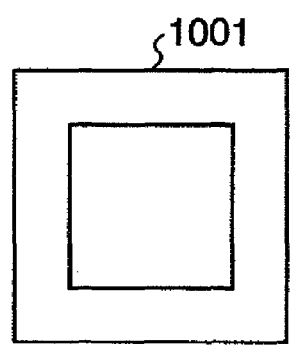
FIG. 10A shows design data.
Figure 10B:
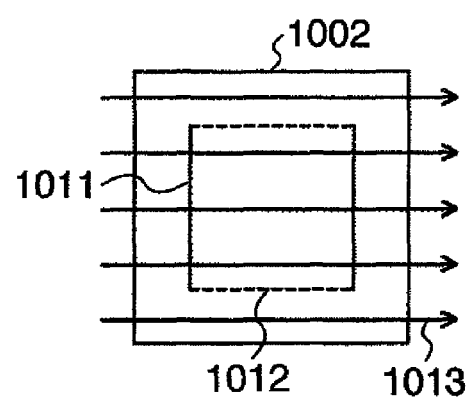
FIG. 10B shows a sample image.
Figure 10C:
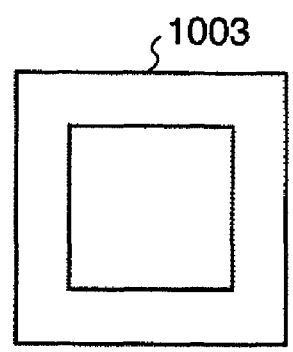
FIG. 10C shows an image that has undergone the image quality improvement operation.

FIGS. 10A to 10C are diagrams showing the effect of performing the edge emphasis operation using the design data in the SEM system. When a portion of a sample corresponding to the design data 1001, an image like a sample image 1002 is obtained. Here, arrows 1013 represent a direction in which a charged particle beam is scanned during the imaging of the sample. In this embodiment, the charged particle beam is scanned in a horizontal direction. In this case, while a vertical edge 1011 perpendicular to the scan direction is clearly shown in the sample image 1002, a horizontal edge 1012 parallel to the scan direction may have a low contrast. However, the use of information of the design data 1001 reveals that the horizontal edge 1012 exists, making it possible to emphasize this edge and display an image such that the displayed vertical and horizontal edges have almost equal contrasts, as in the quality-improved image 1003.

Figure 11A:
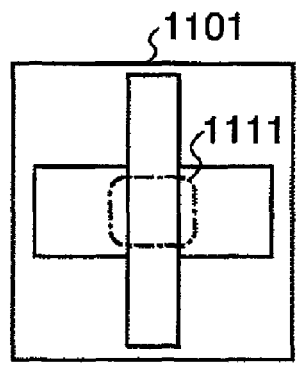
FIG. 11A shows design data including a lower layer.
Figure 11B:
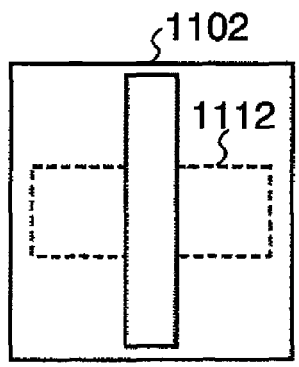
FIG. 11B shows a sample image.
Figure 11C:
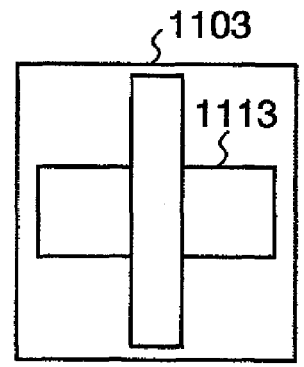
FIG. 11C shows an image that has undergone the image quality improvement operation.

FIGS. 11A to 11C are diagrams showing the effect of emphasizing a lower layer by using the design data (CAD data). When a portion of the sample corresponding to the design data 1101 is imaged, an image such as a sample image 1102 may be produced in which a lower layer 1112 does not have a sufficient contrast. When one wishes to observe the lower layer, it is desired that the lower layer be subjected to an image quality improvement operation to emphasize the lower layer. One may also wish to measure a pattern width in an area of an upper layer that is directly over the lower layer, such as an area 1111. In this case, unless the lower layer is emphasized sufficiently, the area 1111 may be difficult to find. Even in such a case, if the lower layer can be displayed emphasized, as in the case with the quality-improved image 1103, the aforementioned requirement can be met.

Although the above embodiments have been described as example applications of the system using a scanning electron microscope (SEM) to a defect observation device (review SEM) or a pattern dimension measuring device (CD-SEM), the present invention is not limited to these applications but may also be applied to a pattern defect inspection device using a scanning electron microscope (SEM).

Further, this invention can also be applied to a system employing a scanning ion microscope (SIM) or a scanning transmission electron microscope.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning type charged particle beam microscope comprising:
   a charged particle imaging unit having a charged particle beam irradiation unit to irradiate a focused charged particle beam to a surface of a sample formed with a pattern and to scan it over the surface, and
   a secondary charged particle imaging unit to detect secondary charged particles emitted from the sample as the charged particle beam irradiation unit irradiates and scans the charged particle beam over the sample and to generate a secondary charged particle image of the sample surface;
   an image quality improving unit to process the secondary charged particle image of the sample surface generated by the charged particle imaging unit; and
   an output unit to output a result of processing by the image quality improving unit;
   wherein the image quality improving unit aligns the position of the design data of the pattern formed on the sample with the position of the secondary charged particle image of the sample surface generated by the charged particle imaging unit and then improves a quality of the secondary charged particle image of the sample surface by using the design data of the pattern formed on the sample;
   wherein a way of improving the quality of the secondary charged particle image of the sample surface differs according to the design data.

2. A scanning type charged particle beam microscope according to claim 1, wherein the charged particle imaging unit is a scanning electron microscope (SEM) and the image quality improving unit improves a quality of a SEM image of the sample imaged by the scanning electron microscope (SEM).

3. A scanning type charged particle beam microscope according to claim 1, further comprising:
   an image processing unit to process the image whose quality has been improved by the image quality improving unit, and to perform a detection of defects of the sample, a production of an image of defects or a measuring of dimensions of the pattern.

4. A scanning type charged particle beam microscope according to claim 1, wherein the image quality improving unit aligns the position of the design data of the pattern formed on the sample with the position of the secondary charged particle image of the sample surface generated by the charged particle imaging unit and then corrects pattern geometry information of the design data and improves a quality of the secondary charged particle image by using the design data whose geometry information has been corrected.

5. A scanning type charged particle beam microscope according to claim 1, wherein the image quality improving unit aligns the position of the design data of the pattern formed on the sample with the position of the secondary charged particle image of the sample surface generated by the charged particle imaging unit and then divides an area of the secondary charged particle image by using the design data and improves a quality of the divided secondary charged particle image.

6. An image processing method using a scanning type charged particle beam microscope, comprising the steps of:
   irradiating and scanning a focused charged particle beam over a surface of a sample formed with a pattern;
   detecting secondary charged particles emitted from the sample as the focused charged particle beam is irradiated to the sample and creating a secondary charged particle image of the sample surface; and
   processing the created secondary charged particle image of the sample surface;
   wherein, after the position of the design data of the pattern formed on the sample is aligned with the position of the secondary charged particle image of the sample surface, a quality of the created secondary charged particle image of the sample surface is improved by using the design data of pattern formed on the sample,
   wherein a way of improving the quality of the secondary charged particle image of the sample surface differs according to the design data.

7. An image processing method using a scanning type charged particle beam microscope according to claim 6, wherein the focused charged particle beam is an electron beam, the secondary charged particle image of the sample surface is a SEM image, and a quality of the SEM image of the sample surface is improved by using the design data.

8. An image processing method using a scanning type charged particle beam microscope according to claim 6, wherein, after the position of the design data of the pattern formed on the sample is aligned with the position of the secondary charged particle image of the sample surface, a quality of the created secondary charged particle image of the sample surface is improved by using design information or sample characteristic information.

9. An image processing method using a scanning type charged particle beam microscope according to claim 6, wherein, after the position of the design data of the pattern formed on the sample is aligned with the position of the secondary charged particle image of the sample surface, pattern geometry information of the design data is corrected and a quality of the secondary charged particle image is improved by using the design data whose geometry information has been corrected.

10. An image processing method using a scanning type charged particle beam microscope according to claim 6, wherein, after the position of the design data of the pattern formed on the sample is aligned with the position of the secondary charged particle image of the sample surface, an area of the secondary charged particle image is divided by using the design data and a quality of the divided secondary charged particle image is improved.

11. A scanning type charged particle beam microscope according to claim 1,
   wherein the image quality improving unit processes a resolution improvement or noise removing operation or contrast correction.

* * * * *